(12) United States Patent
Sheng et al.

(10) Patent No.: US 10,466,317 B2
(45) Date of Patent: Nov. 5, 2019

(54) ATOMIC MAGNETOMETRY USING PUMP-PROBE OPERATION AND MULTIPASS CELLS

(71) Applicant: THE TRUSTEES OF PRINCETON UNIVERSITY, Princeton, NJ (US)

(72) Inventors: Dong Sheng, Princeton, NJ (US); Shuguang Li, Hangzhou (CN); Nezih Dural, Bordentown, NJ (US); Michael V. Romalis, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 1265 days.

(21) Appl. No.: 14/294,578

(22) Filed: Jun. 3, 2014

(65) Prior Publication Data

US 2014/0354275 A1 Dec. 4, 2014

Related U.S. Application Data

(60) Provisional application No. 61/830,469, filed on Jun. 3, 2013.

(51) Int. Cl.
*G01R 33/26* (2006.01)

(52) U.S. Cl.
CPC .................... *G01R 33/26* (2013.01)

(58) Field of Classification Search
CPC ...... G01R 33/26; G01R 33/24; G01R 33/032; G01N 24/006
See application file for complete search history.

(56) References Cited

U.S. PATENT DOCUMENTS

| 2008/0106261 | A1* | 5/2008 | Romalis | G01R 33/441 324/304 |
| 2009/0243610 | A1* | 10/2009 | Ichihara | G01R 33/0385 324/301 |
| 2012/0176130 | A1* | 7/2012 | Ledbetter | G01N 24/08 324/301 |

(Continued)

OTHER PUBLICATIONS

Vasilakis "Precision Measurements of Spin Interactions with High Density Atomic Vapors", A Dissertation presented to the Faculty of Princeton University, (hereinafter Vasilakis; Published Sep. 2011).*

(Continued)

*Primary Examiner* — Rishi Patel
(74) *Attorney, Agent, or Firm* — MH2 Technology Law Group, LLP

(57) ABSTRACT

A magnetometer for use with a sample including an atomic vapor includes a cell containing the sample such as a multipass cell including a first mirror element and a second mirror element configured so that an incoming light beam injected into the container will reflect multiple times between the first mirror element and the second mirror element. A polarized pump light source is configured to transmit pump light through the cell and pump the sample. A polarized probe light source configured to transmit probe light through the cell and probe the sample. A detector configured to detect a polarization angle or intensity of the probe light transmitted through the sample. A processor may be configured to calculate a precession frequency of the sample based on a first probe light pulse and a frequency correction based on a second probe light pulse.

26 Claims, 4 Drawing Sheets

(56) References Cited

U.S. PATENT DOCUMENTS

| | | | | |
|---|---|---|---|---|
| 2013/0082700 A1* | 4/2013 | Mizutani | ............... | G01R 33/482 |
| | | | | 324/301 |
| 2013/0328557 A1* | 12/2013 | Larsen | ................... | G01R 33/26 |
| | | | | 324/304 |
| 2015/0015251 A1* | 1/2015 | Bulatowicz | ............ | G01C 19/58 |
| | | | | 324/304 |

OTHER PUBLICATIONS

Altmann et al, "Two-mirror multipass absorption cell", Applied Optics, vol. 20, No. 6, Mar. 15, 1981, pp. 995-999.*

Li, S., et al. "Optical rotation in excess of 100 rad generated by Rb vapor in a multipass cell." Physical Review A 84.6 (2011): 061403.*

Sheng, D., et al. "Subfemtotesla scalar atomic magnetometry using multipass cells." Physical review letters 110.16 (2013): 160802.*

* cited by examiner

ATOMIC MAGNETOMETRY USING PUMP-PROBE OPERATION AND MULTIPASS CELLS

CROSS-REFERENCE TO RELATED APPLICATIONS

This application claims the benefit of U.S. Provisional Application No. 61/830,469, entitled: Atomic Magnetometry Using Multipass Cells, filed Jun. 3, 2013, the disclosure of which is incorporate herein by reference.

STATEMENT REGARDING FEDERALLY SPONSORED RESEARCH OR DEVELOPMENT

This invention was made with government support under Grant #FA8650-09-1-7943 awarded by the United States Air Force/Air Force Research Laboratory. The government has certain rights in the invention.

FIELD OF THE INVENTION

The present invention relates to magnetometers, and in particular to magnetometers which rely on optically polarizing an alkali metal vapor and probing the precession frequency of the alkali metal atoms.

BACKGROUND OF THE INVENTION

Current alkali-metal magnetometers can surpass SQUIDs as the most sensitive detectors of a magnetic field, reaching a sensitivity below 1 fT/Hz$^{1/2}$ (I. K. Kominis, et al., Nature (London) 422, 596 (2003); H. B. Dang, et al., Appl. Phys. Lett. 97, 151110 (2010)), but only if they are operated near zero-magnetic field to eliminate spin relaxation due to spin-exchange collisions (W. Happer, et al., Phys. Rev. Lett. 31, 273 (1973); J. C. Allred, et al., Phys. Rev. Lett. 89, 130801 (2002)). Many magnetometer applications, such as searches for permanent electric dipole moments (A. Weis, et al., Nucl. Instrum. Methods Phys. Res., Sect. A 611, 306 (2009)), detection of NMR signals (M. P. Ledbetter, et al., Phys. Rev. Lett. 107, 107601 (2011)), and low-field magnetic resonance imaging (I. Savukov, et al., J. Magn. Reson. 199, 188 (2009)), require sensitive magnetic measurements in a finite magnetic field. In addition, scalar magnetometers measuring the Zeeman frequency are unique among magnetic sensors in being insensitive to the direction of the field, making them particularly suitable for geomagnetic mapping (M. N. Nabighian, et al., Geophysics 70, 33ND (2005)) and field measurements in space (A. Balogh, Space Sci. Rev. 152, 23 (2010); N. Olsen, et al., Space Sci. Rev. 155, 65 (2010)). Highly sensitive magnetometers, particularly magnetometers that do not require near zero-magnetic fields, are therefore desirable.

BRIEF SUMMARY OF THE INVENTION

A magnetometer for use with a sample including an atomic vapor is disclosed. The magnetometer includes a multipass cell containing the sample. The multipass cell includes a first mirror element and a second mirror element configured so that an incoming light beam injected into the container will reflect multiple times between the first mirror element and the second mirror element. A polarized pump light source is configured to transmit pump light through the multipass cell and pump the sample. A polarized probe light source configured to transmit probe light through the multipass cell and probe the sample. A detector configured to detect a polarization angle and/or intensity of the probe light transmitted through the sample.

The mirrors may be configured to allow a beam of laser light to make at least 4 non-reciprocal passes through the multipass cell. The pump light may be circularly polarized. The probe light may be linearly polarized. The magnetometer may also include a radio frequency coil configured to subject the sample to a magnetic field. The sample may include an alkali metal. The sample is selected from the group of consisting of sodium, potassium, rubidium and cesium.

Another embodiment of a magnetometer for use with a sample including an atomic vapor is also disclosed. In this embodiment, the magnetometer includes a polarized pump light source configured to transmit pump light through the sample cell and pump the atomic vapor in the sample cell. A polarized probe light source is configured to transmit first and second polarized probe light pulses through the sample cell to probe the atomic vapor. A detector is configured to detect a polarization angle and/or intensity of the probe light pulses transmitted through the atomic vapor. A processor configured to calculate a precession frequency of the sample based on the first probe light pulse and a frequency correction based on the second probe light pulse.

The pump light may be circularly polarized. The probe light may be linearly polarized. The magnetometer may also include a radio frequency coil configured to subject the sample to a magnetic field. The sample may include an alkali metal. The sample is selected from the group of consisting of sodium, potassium, rubidium and cesium.

A method for detecting magnetic field strength in a sample containing an atomic vapor is also disclosed. The method includes optically pumping the sample with polarized pump light. The sample is exposed to a magnetic field. A first probe light pulse of polarized light is transmitted through the sample. A first rotational frequency of the sample is determined during the first probe light pulse. After a delay time period a second probe light pulse of polarized light is transmitted through the sample. A frequency correction is determined based on the second probe pulse.

The first and second probe pulses may be less than 12 Larmor periods of the atomic vapor in the sample. The delay time period between the first probe pulse and second probe pulse is less than 2 ms. The pump light and probe light may be substantially pulse modulated. The pump light may have a wavelength which is substantially equal to the wavelength of a first D-line atomic transition of the metal vapor. The pump light may have a wavelength which is substantially equal to the $D_1$-line atomic transition of the metal vapor. The pump light may be circularly polarized. The probe light may be linearly polarized. The delay time period may be selected based on a spin relaxation time of the atomic vapor and/or a number of cycles of precession of the atomic vapor.

DETAILED DESCRIPTION OF THE INVENTION

Figure 1:
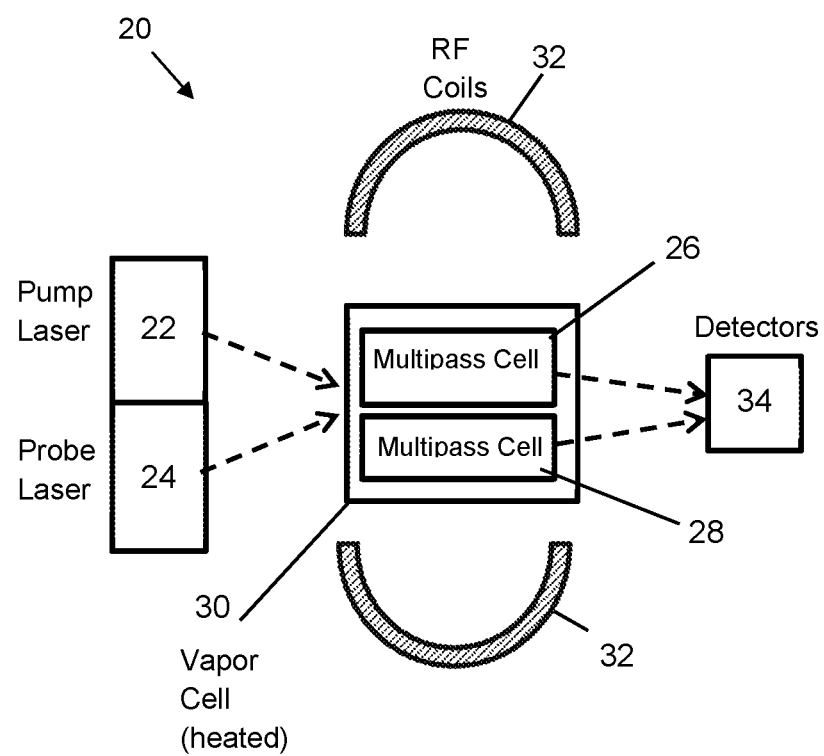
FIG. 1 is a block diagram showing the basic structure of a magnetometer.

Disclosed herein are highly sensitive magnetometers utilizing non-continuous measurement. By increasing the optical depth and optimizing the timing of two pulsed beams, device performance is enhanced, reaching a magnetic field sensitivity of 0.54 $fT/Hz^{1/2}$. This improves by an order of magnitude the best scalar magnetometer sensitivity and exceeds the quantum limit set by the spin-exchange collisions for a scalar magnetometer with the same measurement volume operating in a continuous regime.

The sensitivity of an atomic magnetometer, as any other frequency measurement, is fundamentally limited by spin projection noise and spin relaxation. For N spin-½ atoms with coherence time $T_2$ the sensitivity after a long measurement time $t \gg T_2$ is given by $\delta B = \sqrt{2e/NT_2 t}/\gamma$, where $\gamma$ is the gyromagnetic ratio. Spin squeezing techniques can reduce this uncertainty by a factor of $\sqrt{e}$ but do not change the scaling with N. The number of atoms can be increased until collisions between them start to limit $T_2$. Writing $T_2^{-1} = n\sigma\bar{v}$, where n is the density of atoms $\propto$ is the spin relaxation cross section, and $\bar{v}$ is the average collisional velocity, and taking t=0.5 s to calculate the magnetic field spectral noise density $B_n$ in $T/Hz^{1/2}$, the following is obtained:

$$B_n = (2/\gamma)\sqrt{e\sigma\bar{v}/V} \quad (1)$$

Thus the magnetic field spectral noise density per measurement volume V is fundamentally limited by the spin relaxation cross section. It also sets the limit on the minimum energy resolution per unit bandwidth $\epsilon = B_n^2 V/2\mu_0$ of atomic magnetometers, which can, in certain cases, approach h. In hot alkali-metal vapor magnetometers operating in a finite magnetic field, the relaxation is dominated by the spin-exchange cross section $\sigma_{SE} = 1.9 \times 10^{-14}$ cm$^2$. Taking into account $^{87}$Rb nuclear spin I=3/2, which reduces the spin projection noise by a factor of 2 and the relaxation rate due to spin-exchange collisions by a factor of 5, the limit from Eq. (1) is 0.49 fT cm$^{3/2}$/Hz$^{1/2}$.

However, alkali-metal spin exchange is a nonlinear process with a relaxation rate that changes in time, which modifies the fundamental sensitivity given by Eq. (1). The spin-exchange relaxation can be reduced by optical pumping of atoms into a stretched spin state, but fundamental sensitivity for a scalar magnetometer still remains limited by spin exchange if it is operated in a continuous optical pumping regime. The limit calculated in S. J. Smullin, et al., *Low-noise high-density alkali-metal scalar magnetometer*, Phys. Rev. A 80, 033420 (2009) for a quantum-non-demolition (QND) measurement of the $^{87}$Rb spin is 0.51 fT cm$^{3/2}$/Hz$^{1/2}$. On the other hand, if the magnetometer is operated in a pulsed pump-probe regime and uses QND measurements, the sensitivity can be asymptotically limited by the spin-destruction cross section, which is as low as $\propto_{SD} = 10^{-18}$ cm$^2$ for K atoms, leading to a potential improvement by 2 orders of magnitude.

A key parameter for QND measurements of spin projection noise is the optical depth on resonance OD=$\propto_0$nl, where $\sigma_0$ is the probe laser absorption cross section on resonance and l is the path length of the probe beam through the atomic vapor. Use of optical cells, or containers, with mirrors located on opposite ends of the alkali-metal vapor cell can increase l by 2 orders of magnitude. Compared to optical cavities, these multipass cells have a much larger interaction volume and allow direct recording of large optical rotations.

Figure 2A:
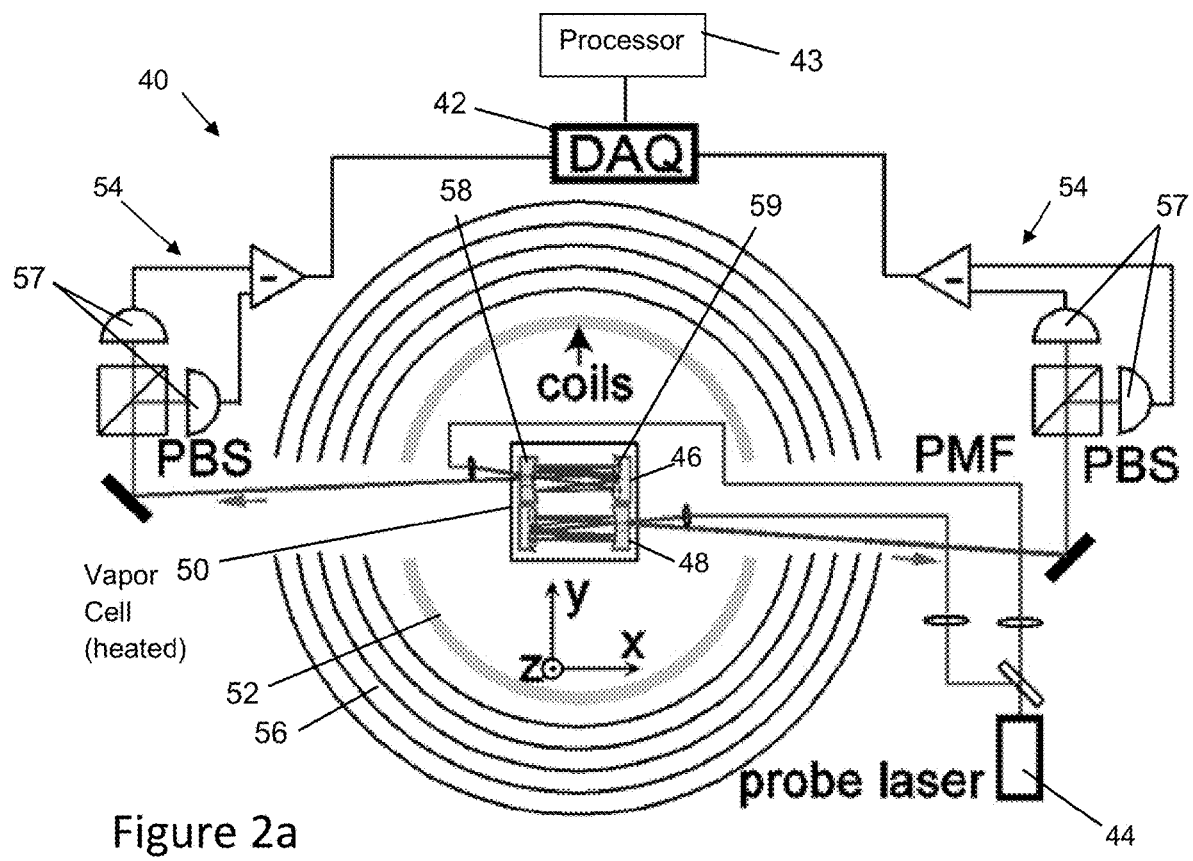
FIG. 2a is a more detailed block diagram showing the structure of a magnetometer.

FIG. 1 is a block diagram showing the basic structure of a magnetometer 20. The magnetometer 20 includes a source of polarized pump light, e.g., pump laser 22 configured to optically pump a sample located in multipass cells or containers 26, 28. In this example, the pump laser is circularly polarized. It should be understood that the pump laser may use other polarizations including linear polarization. The magnetometer 20 also includes a source of polarized probe light, e.g., probe laser 24 configured to optically probe the samples located in multipass cells 26, 28. In this example, the probe laser is linearly polarized. It should be understood that the probe laser may use other polarizations including circular polarization. In this example, the sample is $^{87}$Rb vapor. Also in this example, pump laser 22 and probe laser 24 are shown as separate devices. It should be understood that pump laser 22 and probe laser 24 may be implemented using a wide variety of laser devices and may also be integrated into a single device. Each of the multipass cells 26, 28 generally include a pair located mirrors at opposite ends of the cell, e.g., internal or external to the cell. The multipass cells 26, 28 are generally temperature controlled, e.g., heated and may be located inside a temperature controlled vapor cell 30. In this example vapor cell 30 includes an oven configured to heat the sample contained in the multipass cells. The multipass cells 26, 28 are subjected to a magnetic field generated by RF coils 32. The RF coils 32 may be generally configured to generate a $\pi/2$ RF pulse. Probe laser 24 is configured to transmit a first probe pulse of linearly polarized laser light into the multipass cells 26, 28. The polarized light reflects off the mirrors multiple times, exiting the containers on a non-reciprocal path and being directed to detectors 34 and conversion into an electrical signal. A typical detector will generally include a polarization beam splitter and photo detector or photodiode 57 (as shown in FIG. 2a). After a delay time period, probe laser 24 transmits a second probe pulse of polarized laser light into the multipass cells 26, 28. The second probe pulse reflects off the mirrors multiple times, exiting the containers on a non-reciprocal path and is also directed to the detectors 34 for detection and conversion into an electrical signal.

It should be understood that a variety of pump and probe laser configurations may be used without departing from the scope of this disclosure. FIG. 2a is a more detailed block diagram showing the structure of a magnetometer 40. The magnetometer 40 includes a probe laser 44 (source of linearly polarized light) configured to optically probe a sample of $^{87}$Rb vapor located in multipass cells 46, 48. In this example, the pump laser (source of polarized light) is not shown. Each of the multipass cells 46, 48 include a first mirror 58 and second mirror 59 at opposite ends of the multipass cell. The multipass cells 46, 48 are located inside a temperature controlled vapor cell 50 configured to heat the sample contained in the cells. The multipass cells 46, 48 are subjected to a magnetic field generated by RF coils 52. The RF coils 52 may be generally configured to generate a $\pi/2$ RF pulse. An RF shield 56 may also be used to shield surrounding equipment from the RF field. The probe laser 44 is configured to transmit a first probe pulse of linearly polarized laser light into the multipass cells 46, 48. The first probe pulse reflects off the mirrors multiple times, exiting the containers on a non-reciprocal path and being directed to detectors and conversion into an electrical signal. The detectors generally include a polarization beam splitter and a photo detector or photo diode a shown generally by reference number 54. The electrical signal is then directed to a data acquisition system shown general by block 48 that converts the electrical signal to digital. After a delay time period, probe laser 44 transmits a second probe pulse of linearly polarized laser light into the multipass cells 46, 48. The second probe pulse reflects off the mirrors multiple times, exiting the containers on a non-reciprocal path and is also directed to the detectors 54 for detection and conversion into an electrical signal. The electrical signal from the second probe pulse is then directed to data acquisition system 58 for conversion to a digital signal. The data acquisition system 42 is coupled to a digital processor 43 that calculates the precession frequency of the sample and a frequency correction based on the approach outlined below.

Figure 2B:
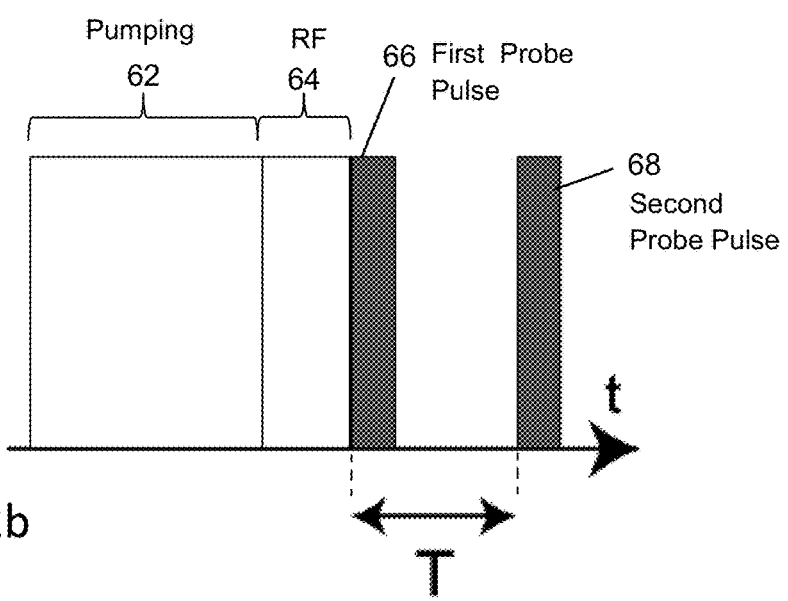
FIG. 2b is a graph showing the timing of pump-probe operation.
Figure 3:
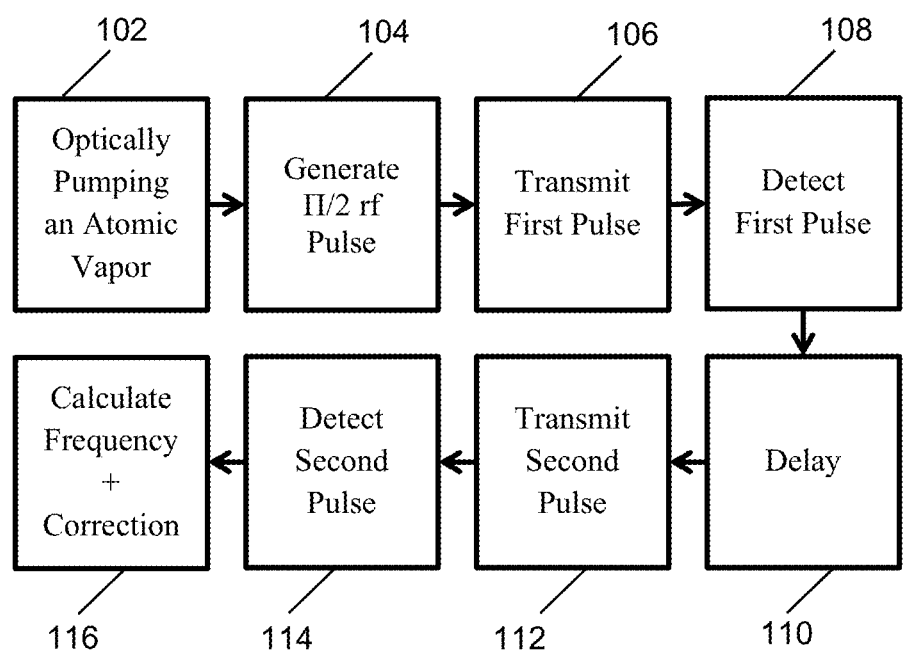
FIG. 3 is a flowchart showing the basic steps of a method for detecting magnetic field strength.

FIG. 2b is a graph showing the timing of the pump-probe operation. It should be understood that pump-probe operation may be implemented with or without multipass cells. FIG. 3 is a flowchart showing the basic steps of a method for detecting magnetic field strength. Referring to FIGS. 2b and 3, the pump laser (polarized light source) is configured to optically pump a sample located in the multipass cells as shown by reference numbers 62 and 102. When the atomic vapor (sample) is exposed to circularly polarized pump laser light, it transfers angular momentum from the laser the atoms present in the sample. This aligns the spins of the atoms in the sample. The duration of the pump operation generally depends on the power of the pump laser. Typical pump durations range from a fraction of a millisecond to a few miliseconds. A variety of techniques may be used to determine the pump duration as is well known in the art. Once the spins are aligned and the pump light is switched off, the spin alignment will decay. The rate of decay generally depends at least in part on the level of polarization. Polarization to high degree or the more completely the spins atoms in the sample are aligned the slower the spin alignment decay (and the longer time period for accurate measurement). In general, it is important to quickly begin the measurement of spin precession after the pump laser is switched off.

Once the pump laser is switched off, the multipass cells are subjected to a magnetic field generated by RF coils as shown generally by block 64. The RF field is generated by a sine wave having a frequency is selected based on the type of atoms in the sample and the amplitude of the magnetic field that the sample will be exposed to. This causes the atoms in the sample to generally precess around the magnetic field. The RF coils may be generally configured to generate a $\pi/2$ RF pulse as shown by block 104. The probe laser is configured to transmit a first probe pulse of linearly polarized laser light into the multipass cells as shown by reference numbers 66 and 106. Typical probe pulse duration is about 100 $\mu$sec. The probe pulse duration is typically several cycles of precession of the atoms in the sample (Larmor periods) and may be further adjusted based on the signal to noise ratio. The first probe pulse reflects off the mirrors multiple times, exiting the multipass cells on a non-reciprocal path and being directed to the detectors for conversion into an electrical signal as shown by reference number 108. The electrical signal is then directed to a data acquisition system shown that converts the electrical signal to digital.

After a delay time period T, the probe laser transmits a second probe pulse of polarized laser light into the multipass cells 46 as shown by reference numbers 68, 110 and 112. The delay period is generally selected based on the spin relaxation time. A longer delay period will yield a more accurate frequency measurement since this measurement is based on counting the number of cycles of precession (more cycles yields a more accurate measurement). However, it is also desirable to measure the second probe pulse before the atoms have a chance to decay. In general, the time delay is selected to maximize the number of precessions while minimizing the loss of spin. The second probe pulse reflects off the mirrors multiple times, exiting the containers on a non-reciprocal path and is also directed to the detectors for conversion into an electrical signal as shown by reference number 114. The electrical signal from the second probe pulse is then directed the data acquisition system for conversion to a digital signal. In general, the precession frequency of the sample may be approximated using the data from the first probe pulse. The data from the first probe pulse is used to calculate the precession frequency of the sample and the data from the second probe pulse is used to correct or refine the calculated precession frequency based on a comparison of the phase of the optical rotation between the first probe pulse and the second probe pulse as shown by reference number 116. In general, the correction will be less than one period of optical rotation.

Figure 2C:
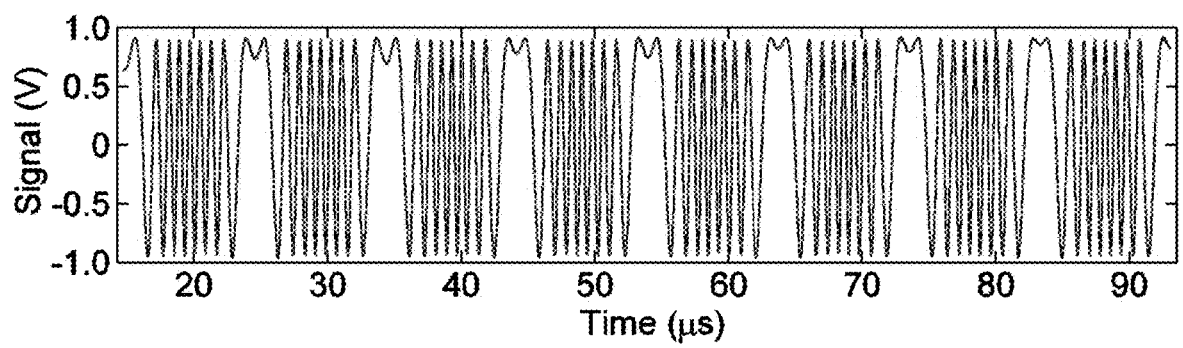
FIG. 2c is a graph showing the optical rotation (black line) recorded for one probe pulse at atom density of $0.8 \times 10^{13}$/cm$^3$ together with a fitted curve (red dashed line)
Figure 2D:
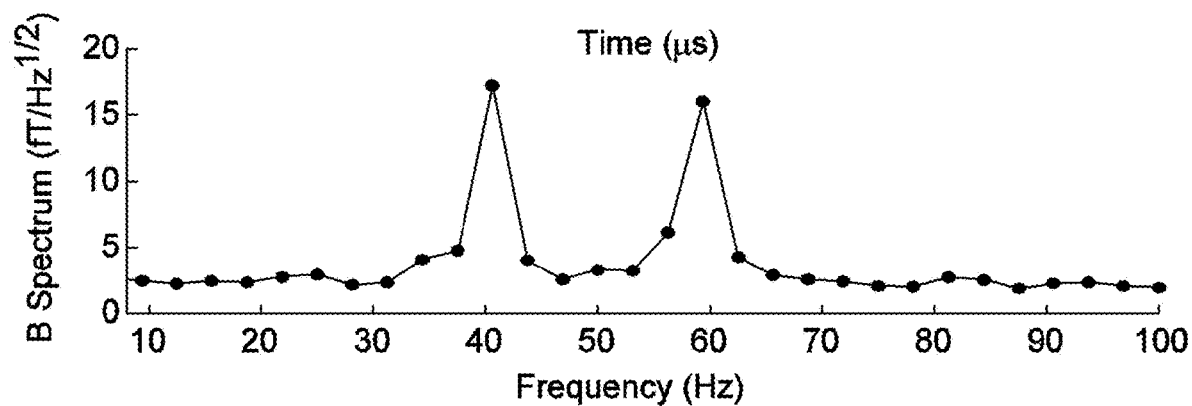
FIG. 2d is a graph showing the magnetic field noise spectrum obtained in the gradiometer in the presence of a calibrating magnetic field gradient at 40 Hz.

FIG. 2c is a graph showing the optical rotation (black line) recorded for one probe pulse at atom density of $0.8 \times 10^{13}/\text{cm}^3$ together with a fitted curve (red dashed line). This is graph is basically the output of the detector photodiode during the probing stage. This signal may be processed using a mathematical transform such as a Fourier transform to yield a frequency. It is noted that the waveform shape in FIG. 2c reflects that a multipass cell is used. If a single pass cell was used, the output of the photodiode would be a sine wave. The processing of the complex waveform in FIG. 2c is outlined below. FIG. 2d is a graph showing the magnetic field noise spectrum obtained in the gradiometer in the presence of a calibrating magnetic field gradient at 40 Hz. The peak at 60 Hz is due to ac line noise.

In one example, the magnetometer utilizes two 42-pass cells (multipass cells) placed in temperature controlled vapor cell configured as a gradiometer with a baseline equal to the 1.5 cm distance between the cells. The multipass cells have cylindrical mirrors with a 10 cm radius of curvature separated by 30 mm. One of the mirrors in each multipass cell has a 2.5 mm diameter hole for entrance and exit of the probe beam focused to a waist diameter of 1.9 mm. In this example, the vapor cell contains a drop of enriched $^{87}$Rb and 70 torr $N_2$ gas. A boron-nitride oven is used to heat the vapor cell using ac currents at 600 kHz to 120° C., giving an OD~5000. The vapor cell is placed in a bias magnetic field of 72.9 mG in the $\hat{z}$ direction generated by an ultrastable custom current source and is enclosed in a five-layer magnetic shield.

The atom density n is measured from the transverse relaxation $T_2$ at low polarization, which is dominated by spin-exchange collisions with a known cross section. The number of atoms participating in the measurement at any given time $N = nV_b$ is determined from the area of Faraday rotation power spectral density for unpolarized atoms. Measurements can be made of the noise peak at two different magnetic fields and take their difference to remove the background dominated by photon shot noise.

While diffusion does not affect the area under the spin noise peak, it causes the line shape of the noise spectrum to deviate from a simple Lorentzian. To analyze it quantitatively, consider the time autocovariance function of the Faraday rotation signal $\phi(t)$, which is given by the Fourier transform of the power spectrum. One can show that $$\langle \phi(t)\phi(t+\tau)\rangle =$$

$$\Sigma_i \left(\frac{cr_e fD_i}{(2I+1)\int I(r)dydz}\right)^2 \times n\langle F_i^2\rangle \times \int I(r_1)G(r_1-r_2,\tau)I(r_2)d^3r_1 d^3r_2,$$

where the sum is taken over the two alkali-metal hyperfine states, $F_a = I+\frac{1}{2}$ and $F_b = I-\frac{1}{2}$, and $$\langle F_i^2 \rangle = \frac{F_i(F_i+1)(2F_i+1)}{6(2I+1)}.$$

The dispersion factor is $D_i=1/(\nu_i-\nu)$ for far detuning of the probe frequency $\nu$ from the hyperfine resonances $\nu_i$. Here $I(r)$ is the total probe laser intensity at position r, including all beam passes inside the cavity, and $G(r, \tau)$ is the Green's function for spin evolution with a diffusion coefficient D and a transverse relaxation time $$T_2, \; G(r,\tau) = e^{-\frac{r^2}{4D\tau} - \frac{\tau}{T_2}} \Big/ (4\pi D\tau)^{3/2}.$$

The intensity profile of the probe laser in the cell is determined by measuring the input Gaussian beam size and calculating the astigmatic Gaussian beam propagation in the multipass cell. The effective number of atoms participating in the measurement is defined as the number of atoms that would generate the same spin noise area $\langle \phi(t)^2 \rangle$ if interrogated with a uniform probe intensity. A generalization of a result is obtained that works for laser beams with varying focusing and overlap, $$N = \frac{nl^2\left[\int I(r)dydz\right]^2}{\int I(r)^2 dV},$$

where l is the total probe laser path in the multipass cell.

In one embodiment, the optical pumping phase lasts 14 ms, and utilizes two circular polarized beams on resonance with the D1 transitions from both ground hyperfine states. A $\pi/2$ RF pulse lasting three periods of the Zeeman resonance frequency is then applied. The first probe light pulse is then applied, followed by a second probe pulse with a delay time period T from the first one. The probe laser is tuned to 794.780 nm and the power of the light exiting from each multipass cell is about 0.5 mW. The probe light is turned on and off slowly compared with the Larmor period using an acousto-optic modulator to suppress transient spin excitation. The pump-probe cycle is repeated every 16.6 msec, synchronized with 60 Hz to reduce its influence.

The optical rotation signal is then fit to the equation $$V = V_o \sin\left[2\phi\left(1 - \frac{t-t_c}{T_2}\right)\sin[\omega(t-t_c)] + \psi\right] + B.$$

First find the time of zero crossings $t_{c1}$, $t_{c2}$ of the first and second pulses and then calculate $T_c = t_{c2} - t_{c1}$, which gives a measure of the magnetic field $B = 2\pi m/\gamma T_c$, where m is the integer number of spin precession cycles between the measured zero crossings. If the measurements are repeated with overall duty cycle d, then the magnetic field sensitivity per $Hz^{1/2}$ is given by $B_n = B\delta T_c \sqrt{2/dT_c}$, (2), where $\delta T_c$ is the standard deviation of repeated measurements of $T_c$.

In one embodiment, two multipass cells work as a gradiometer to measure $\partial B_z/\partial y$ with a noise level that is $\sqrt{2}$ larger than given by Eq. (2) while canceling common magnetic noise. The calibration of a scalar magnetometer is given by fundamental constants, but its response to gradients is checked by applying a calibrated magnetic field gradient $\partial B_z/\partial y$ with rms amplitude of 21.6 fT/cm oscillating at 40 Hz. For this measurement in one example, the atomic density is $1.4 \times 10^{13}$ cm$^3$, with the probe pulse length of four Larmor periods, the separation between two probe pulses T=823 μs, and the cycle period is 5 ms.

The limiting fundamental noise sources include atomic spin projection noise (ASN) and photon shot noise (PSN), while technical sources include magnetic shield noise and time jitter of the data acquisition. One aspect of this disclosure is backaction evasion of quantum fluctuations of the probe beam circular polarization due to zero spin polarization of atoms in the $\hat{z}$ direction following the $\pi/2$ pulse. Comparing the noise on the rf excitation amplitude when the disclosed system deviates from the $\pi/2$ amplitude with the noise in $T_c$ when using a stroboscopic probe modulation backaction evasion scheme, confirms that the magnetometer works in a backaction-free regime. The magnetic shield gradient noise is due to thermal Johnson currents and is calculated based on known electrical conductivity of the inner μ-metal shield, giving 0.40(5) fT/Hz$^{1/2}$. The time jitter noise is determined by recording the signals from the same multipass cell with two acquisition channels and ranges from 0.3 to 0.5 ps depending on the length of the probe pulse.

Plotting the sensitivity as a function of the probe pulse length $t_p$, it is found that the variance in $T_c$ due to PSN and data acquisition noise decreases as $1/t_p$ and the variance due to ASN also decreases because atom diffusion effectively involves more atoms into the measurement. The effective number of atoms $N_m$ participating in the measurement after a pulse time $t_p$ can be found using the diffusion correlation function $$N_m = nV_b t_p \Big/ \left[2\int_0^{t_p}\left(1 - \frac{t}{t_p}\right)C_d(t)\,dt\right].$$

For the longest pulse length of 230 μsec one embodiment obtains $V_m = 1.9 V_b$, corresponding to an effective interaction volume of 0.66 cm$^3$. When the atom density increases, the optimal T decreases because of faster spin relaxation, indicating that the magnetometer works in a Rb collision-limited regime. For the longest probe pulse length and atom density of $1.4 \times 10^{13}$/cm$^3$, the experimental data show a best sensitivity of $0.54 \pm 0.03$ fT/Hz$^{1/2}$. In the absence of magnetic shield noise the intrinsic sensitivity is projected to be 0.3 fT/Hz$^{1/2}$, dominated by ASN. For comparison, the quantum limit for the best previously considered scalar magnetometer using QND measurements with continuous pumping is equal to 0.63 fT/Hz$^{1/2}$ for the same measurement volume.

The references listed herein are also part of the application and are incorporated by reference in their entirety as if fully set forth herein including Sheng et al., *Subfemtotesla Scalar Atomic Magnetometry Using Multipass Cells*, Phys. Rev. Lett. 110, 160802 (2013). It should be understood that many variations are possible based on the disclosure herein. Although features and elements are described above in particular combinations, each feature or element can be used alone without the other features and elements or in various combinations with or without other features and elements. The methods or flow charts provided herein may be at least partially implemented in a computer program, software, or firmware incorporated in a non-transitory computer-readable storage medium for execution by a general purpose computer or a processor. Examples of computer-readable storage mediums include but are not limited to read only memory (ROM), a random access memory (RAM), a register, cache memory, semiconductor memory devices, magnetic media such as internal hard disks and removable disks, magneto-optical media, and optical media.

What is claimed is:

1. A magnetometer for use with a sample including an atomic vapor, the magnetometer comprising:
   an enclosure;
   a multipass cell positioned within the enclosure, wherein the multipass cell contains the sample and comprises a first mirror element and a second mirror element configured so that an incoming light beam injected into the enclosure will reflect multiple times between the first mirror element and the second mirror element, wherein the incoming light beam comprises a pump light or a probe light;
   a polarized pump light source configured to transmit the pump light through the multipass cell and pump the sample;
   a polarized probe light source configured to transmit a first pulsed probe light and a second pulsed probe light through the multipass cell and probe the sample, wherein the first pulsed probe light and the second pulsed probe light are transmitted separately in time based on a spin relaxation time of the sample; and
   a detector configured to detect a polarization angle or intensity of the probe light transmitted through the sample.

2. The magnetometer of claim 1, wherein the mirrors are configured to allow a beam of laser light to make at least 4 non-reciprocal passes through the multipass cell.

3. The magnetometer of claim 1, wherein the pump light is circularly polarized.

4. The magnetometer of claim 1, wherein the probe light is linearly polarized.

5. The magnetometer of claim 1, wherein the magnetometer further comprises a radio frequency coil configured to subject the sample to a magnetic field.

6. The magnetometer of claim 1, wherein the sample comprises an alkali metal.

7. The magnetometer of claim 1, wherein the sample is selected from the group of consisting of sodium, potassium, rubidium and cesium.

8. A magnetometer for use with a sample including an atomic vapor, the magnetometer comprising:
   an enclosure;
   a multipass sample cell positioned within the enclosure, wherein the multipass sample cell contains the sample;
   a polarized pump light source configured to transmit pump light through the multipass sample cell and pump the atomic vapor in the multipass sample cell;
   a polarized probe light source configured to transmit first and second polarized probe light pulses through the multipass sample cell to probe the atomic vapor, wherein the first polarized probe light pulse and the second polarized probe light pulse are transmitted separately in time based on a spin relaxation time of the sample;
   a detector configured to detect a polarization angle or intensity of the probe light pulses transmitted through the atomic vapor; and
   a processor configured to calculate a precession frequency of the sample based on the first probe light pulse and a frequency correction based on the second probe light pulse.

9. The magnetometer of claim 8, wherein the pump light is circularly polarized.

10. The magnetometer of claim 8, wherein the probe light is linearly polarized.

11. The magnetometer of claim 8, wherein the magnetometer further comprises a radio frequency coil configured to subject the sample to a magnetic field.

12. The magnetometer of claim 8, wherein the sample comprises an alkali metal.

13. The magnetometer of claim 8, wherein the sample is selected from the group of consisting of sodium, potassium, rubidium and cesium.

14. A method for detecting magnetic field strength in a sample containing an atomic vapor, the method comprising:
   optically pumping the sample with polarized pump light, wherein the sample is positioned in a multipass cell comprising a first mirror element and a second mirror element positioned within an enclosure and configured so that an incoming light beam reflects multiple times between the first mirror element and the second mirror element, wherein the incoming light beam comprises the polarized pump light, a first probe light pulse, and a second probe light pulse;
   exposing the sample to a magnetic field;
   transmitting the first probe light pulse of polarized light through the sample;
   determining a first rotational frequency of the sample during the first probe light pulse;
   waiting for a delay time period and then transmitting the second probe light pulse of polarized light through the sample, wherein the delay time is based on the spin relaxation time of the sample; and
   determining a frequency correction based on the second probe pulse.

15. The method of claim 14, wherein the length of the first and second probe pulses are less than 12 Larmor periods of the atomic vapor in the sample.

16. The method of claim 14, wherein the delay time period between the first probe pulse and second probe pulse is less than 2 ms.

17. The method of claim 14, wherein the pump light and probe light is substantially pulse modulated.

18. The method of claim 14, wherein the pump light has a wavelength which is substantially equal to the wavelength of a first D-line atomic transition of the metal vapor.

19. The method of claim 14, wherein the pump light has a wavelength which is substantially equal to the $D_1$-line atomic transition of the metal vapor.

20. The method of claim 14, wherein the pump light is circularly polarized.

21. The method of claim 14, wherein the probe light is linearly polarized.

22. The method of claim 14, wherein the delay time period is selected based on a spin relaxation time of the atomic vapor.

23. The method of claim 14, wherein the delay time period is selected based on a number of cycles of precession of the atomic vapor.

24. The method of claim 23, wherein the delay time period is selected based on a spin relaxation time of the atomic vapor and a number of cycles of precession of the atomic vapor.

25. The magnetometer of claim 1, wherein the first mirror element and the second mirror element are curved.

26. The magnetometer of claim 1, wherein the detector is operable to detect changes to magnetic fields with a magnetic field sensitivity of less than 10 $fT/Hz^{1/2}$.

* * * * *